(12) United States Patent
Chen

(10) Patent No.: US 10,749,057 B2
(45) Date of Patent: Aug. 18, 2020

(54) SENSING DEVICE AND SENSING METHOD

(71) Applicants: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

(72) Inventor: Yu-Ju Chen, Zhunan (TW)

(73) Assignees: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

( * ) Notice: Subject to any disclaimer, the term of this patent is extended or adjusted under 35 U.S.C. 154(b) by 86 days.

(21) Appl. No.: 16/251,380

(22) Filed: Jan. 18, 2019

(65) Prior Publication Data
US 2020/0135949 A1 Apr. 30, 2020

(30) Foreign Application Priority Data
Oct. 25, 2018 (CN) .......................... 2018 1 1247937

(51) Int. Cl.
| | |
|---|---|
| H01L 31/0352 | (2006.01) |
| G06K 9/00 | (2006.01) |
| G06K 9/20 | (2006.01) |
| H01L 31/032 | (2006.01) |
| H01L 31/0328 | (2006.01) |
| H01L 31/113 | (2006.01) |
| H01L 31/167 | (2006.01) |
| H01L 33/30 | (2010.01) |

(52) U.S. Cl.
CPC .. *H01L 31/035218* (2013.01); *G06K 9/00885* (2013.01); *G06K 9/209* (2013.01); *H01L 31/032* (2013.01); *H01L 31/0328* (2013.01); *H01L 31/1136* (2013.01); *H01L 31/167* (2013.01); *H01L 33/30* (2013.01); *G06K 2009/00932* (2013.01)

(58) Field of Classification Search
CPC .......... H01L 31/035218; H01L 31/302; H01L 31/0328; H01L 31/1136; H01L 31/167; H01L 33/30; G06K 9/00885; G06K 9/209; G06K 2009/00932
See application file for complete search history.

(56) References Cited

U.S. PATENT DOCUMENTS

2016/0266695 A1* 9/2016 Bae .................... G06K 9/00053

* cited by examiner

Primary Examiner — Courtney D Thomas
(74) Attorney, Agent, or Firm — ScienBiziP, P.C.

(57) ABSTRACT

A device for sensing suspension operations or biometrics includes a light emitting module and a sensing layer. The light emitting module and the sensing layer are sequentially stacked. The light emitting module includes a plurality of light emitting elements emitting light near the infrared and the sensing layer includes a plurality of quantum dot thin film transistors. The quantum dot thin film transistor includes an active layer and quantum dots covering the active layer. The near-infrared light emitted by the plurality of light emitting elements is reflected by an animate object and received by the quantum dot thin film transistors. The sensing device can better sense suspension operations or biometrics. A method for the procedure is also disclosed.

16 Claims, 10 Drawing Sheets

SENSING DEVICE AND SENSING METHOD

FIELD

The subject matter herein generally relates to a sensing device for sensing suspension operations or biometrics.

BACKGROUND

Display devices incorporating a function of biometrics or sensing suspension operations such as sensing coordinates of a floating object are popular. Such devices for sensing suspension operations or biometrics typically include capacitive sensing devices and infrared sensing devices. However, the capacitive sensing device generally uses self-capacitance which results in a higher cost, and the infrared sensing device requires both infrared light source and receiver. The capacitive sensing device and the infrared sensing device are difficult to minimize in size and lower in cost.

Therefore, there is room for improvement in the art.

BRIEF DESCRIPTION OF THE DRAWINGS

Implementations of the present technology will now be described, by way of embodiments, with reference to the attached figures.

DETAILED DESCRIPTION

Figure 1:
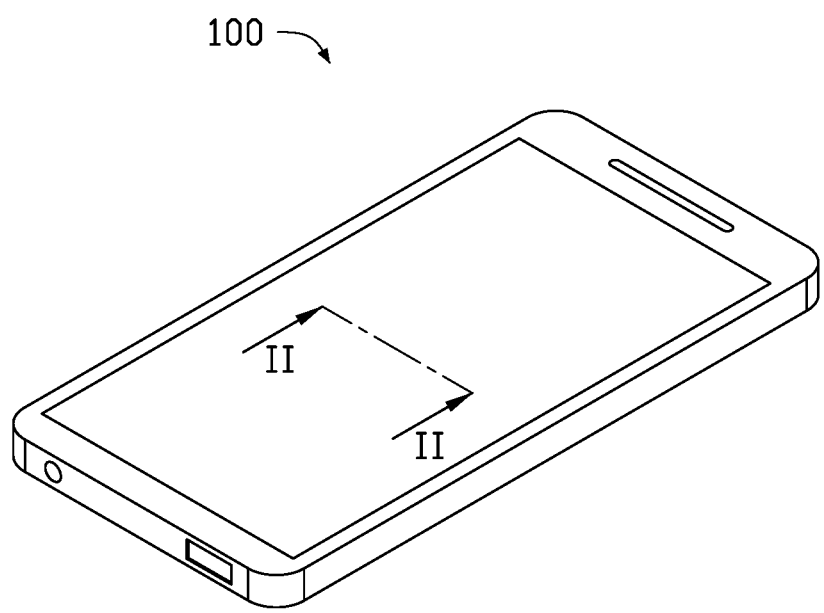
FIG. 1 is a planar view of a sensing device according to a first embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series, and the like.

Figure 2:
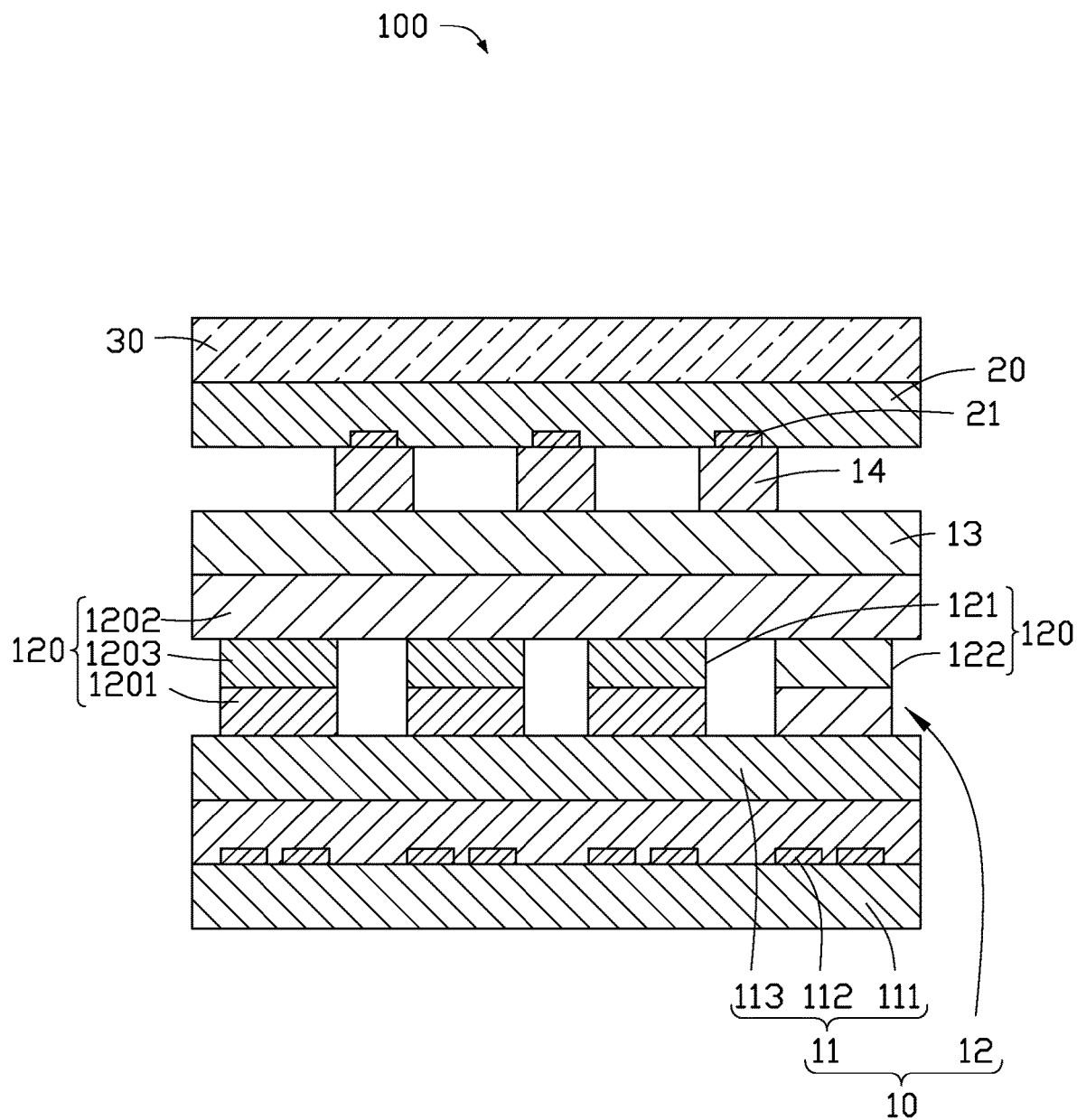
FIG. 2 is a cross-sectional view along line II-II of FIG. 1.

As shown in FIG. 1 and FIG. 2, in a first embodiment, the sensing device 100 comprises a display panel 10, a sensing layer 20, and a cover 30. The cover 30 is made of transparent material such as glass, plastic, or other transparent materials.

In this embodiment, the display panel 10 comprises a thin film transistor array substrate (TFT substrate) 11 and a light emitting layer 12 formed on the TFT substrate 11. The TFT substrate 11 comprises a substrate 111, a plurality of thin film transistors (TFTs) 112 formed on the substrate 111, and a planarization layer 113 covering the TFTs 112. The light emitting layer 12 comprises a plurality of light emitting elements 120.

In this embodiment, the light emitting elements 120 comprise a plurality of first light emitting elements 121 and a plurality of second light emitting elements 122. In an embodiment, each first light emitting element 121 is a first micro light emitting diode (micro LED), and each second light emitting element 122 is a second micro LED. Size of each of the first micro light emitting diodes and the second micro light emitting diodes is smaller than 50×50 μm. The TFTs 112 can be used to control the first light emitting elements 121 and the second light emitting elements 122.

In this embodiment, the sensing device 100 can not only display, but also can sense a suspension operation. The first light emitting elements 121 are adapted for displaying, and the second light emitting elements 122 are adapted for sensing the suspension operation. In this embodiment, the first light elements 121 comprise a plurality of first light emitting elements 121 that emit red light, green light, and blue light. The second light emitting elements 122 emit light of the wavelength of near infrared light. In this embodiment, the near infrared light emitted by the second light emitting element 122 has a wavelength between 830 nm and 1550 nm. In other embodiment, a plurality of first light emitting elements 121 that emit white light can also be provided.

Figure 3:
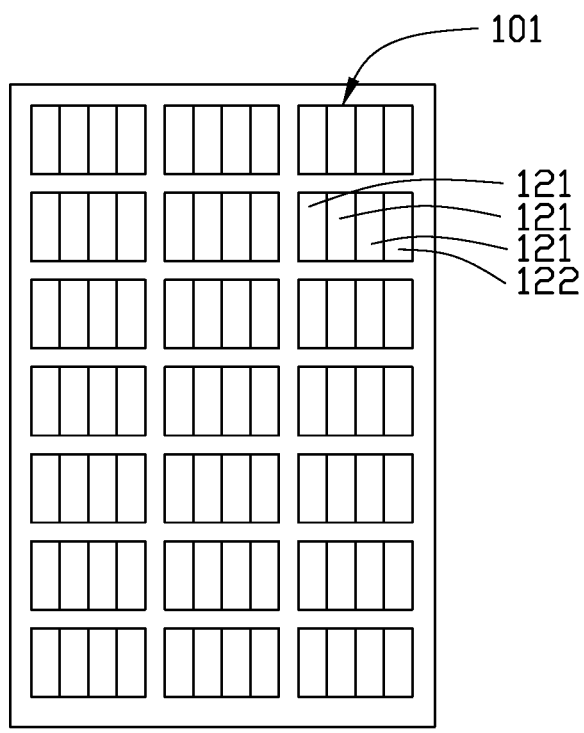
FIG. 3 is a planar view of a pixel layout of a display panel according to the first embodiment.

As shown in FIG. 3, the display panel 10 defines a plurality of pixel units 101. In this embodiment, each pixel unit 10 comprises the first light emitting element 121 that emits red light, green light, and blue light, and the second light emitting element 122 that emit near infrared light. In other embodiment, structure of each pixel unit 101 may not be limited to the structure shown in FIG. 3, as long as each pixel unit 101 comprises at least one first light emitting element 121 and at least one second light emitting element 122. In this embodiment, the second light emitting elements 122 adapted for sensing the suspension operation and the first light emitting element 121 adapted for displaying are formed on the same layer, and are formed in the same process. No additional process is required to provide a near infrared light source, reducing a thickness of the display panel and a manufacturing cost of the sensing device 100 can be lowered.

Figure 4:
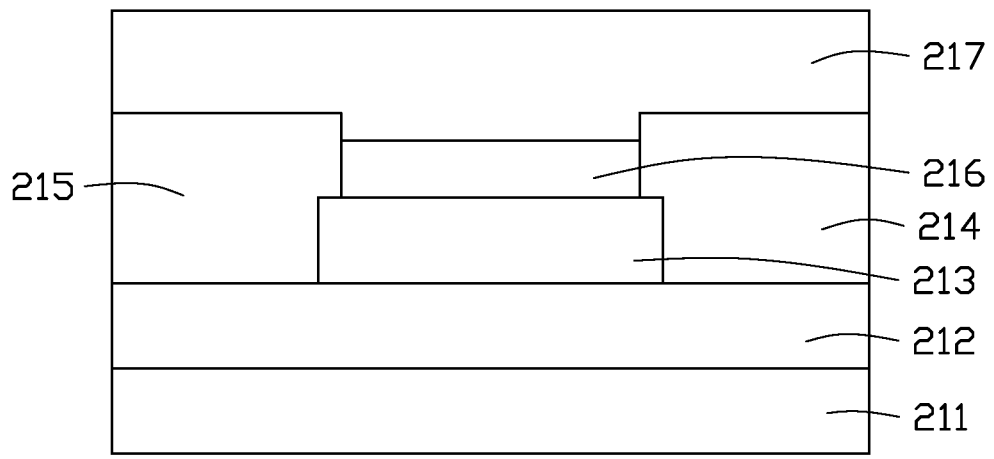
FIG. 4 is a cross-sectional view of a quantum dot thin film transistor according to the first embodiment.

As shown in FIG. 2 and FIG. 4, the sensing layer 20 comprises a plurality of quantum dot thin film transistors (QD TFTs) 21. The sensing layer 20 is located on a side of the display panel 10 adjacent to the cover 30. The sensing layer 20 receives reflections of near infrared light that is transmitted through the cover 30 to the QD TFTs 21. In this embodiment, the cover 30 can serve as a substrate of the sensing layer 20, the sensing layer 20 can be directly formed on the cover 30. In this embodiment, the QD TFTs are arranged in an array. As shown in FIG. 4, each QD TFT 21 comprises a gate electrode 211, a gate insulating layer 212, a channel layer 213, a source electrode 214, and a drain electrode 215.

In this embodiment, each QD TFT 21 further comprises a quantum dot layer 216 and an insulating layer 217. The quantum dot layer 216 covers the channel layer 213 and is in direct contact with the channel layer 213. The insulating layer 217 covers the source electrode 214, drain electrode 215, and the quantum dot layer 216. In this embodiment, the channel layer 213 is made of Indium Gallium Zinc Oxide (IGZO). The quantum dot layer 216 is made of lead sulfide (PbS). In other embodiment, the channel layer 2123 may be made of amorphous silicon (a-Si) or low temperature polysilicon (LTPS). The particle diameter of the quantum dot in the quantum dot layer 216 can be adjusted according to the wavelength of the near infrared light. In this embodiment, the particle diameter of the quantum dot is between 3 nm and 9 nm, and the absorption wavelength ranges from 700 nm to 1800 nm. The quantum dots generate a slight current under the illumination of near infrared light, thereby changing the conductivity of the channel layer 213.

Figure 5:
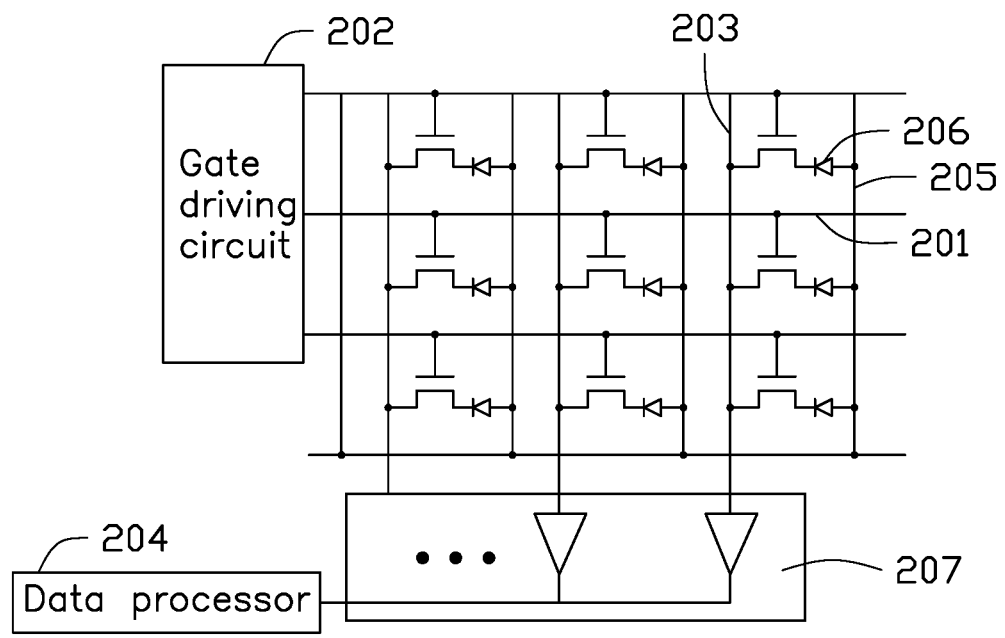
FIG. 5 is an equivalent circuit diagram of a sensing layer according to the first embodiment of the present disclosure.

As shown in FIG. 5, the sensing layer 20 further includes a plurality of gate lines 201, a gate driving circuit 202, a plurality of data lines 203, a data processor 204, a plurality of bias lines 205, and a plurality of photodiodes 206. The gate driving circuit 202 is electrically coupled to the gate electrode 211 of the QD TFT 21 by the gate line 211 to drive the QD TFT 21. The source electrode 214 of each QD TFT 21 is coupled to a photodiode 206, and the drain 215 is coupled to the data line 203. The electrical signal output by the bias line 205 is transmitted to the data processor 204 via the photodiode 206, the QD TFT 21, and the current amplifier 207. In this embodiment, when the near infrared light illuminating the quantum dot layer 216 changes the conductivity of the channel layer 213, so that the electrical signal passing through the QD TFT 21 is changed. and the data processor 204 obtains a result by analyzing the change of the electrical signal.

Figure 6:
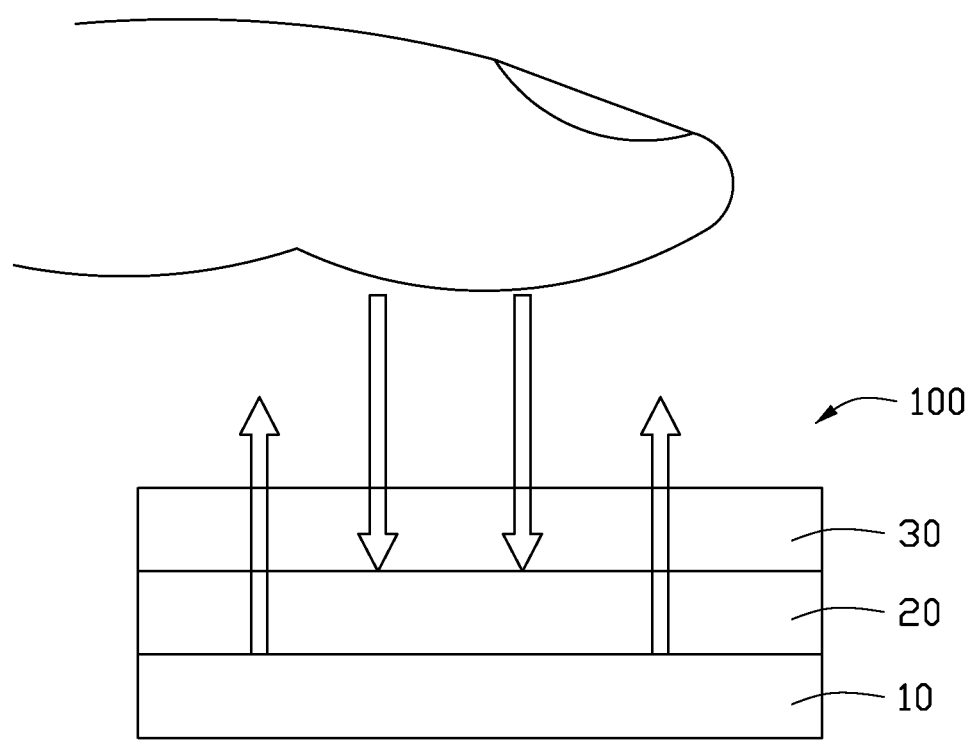
FIG. 6 is a schematic view showing the sensing device according to the first embodiment of the present disclosure when sensing a suspension operation.

As shown in FIG. 6, in this embodiment, after the near infrared light emitted by the second light emitting element 122 irradiates the finger, blood vessels in the fingers (such as veins) absorb most of the near infrared light. The near infrared light that irradiates an avascular area of the finger is reflected, such that the near-infrared light absorbed by the quantum dot layer 216 is changed. This is a sensing signal. The sensing signal is then fed back to a signal processor to form a specific blood vessel map and determine the coordinates of the blood vessels. When the finger moves, the sensing device 100 can detect the movement trajectory of the blood vessels to sense the suspension operation.

Figure 7:
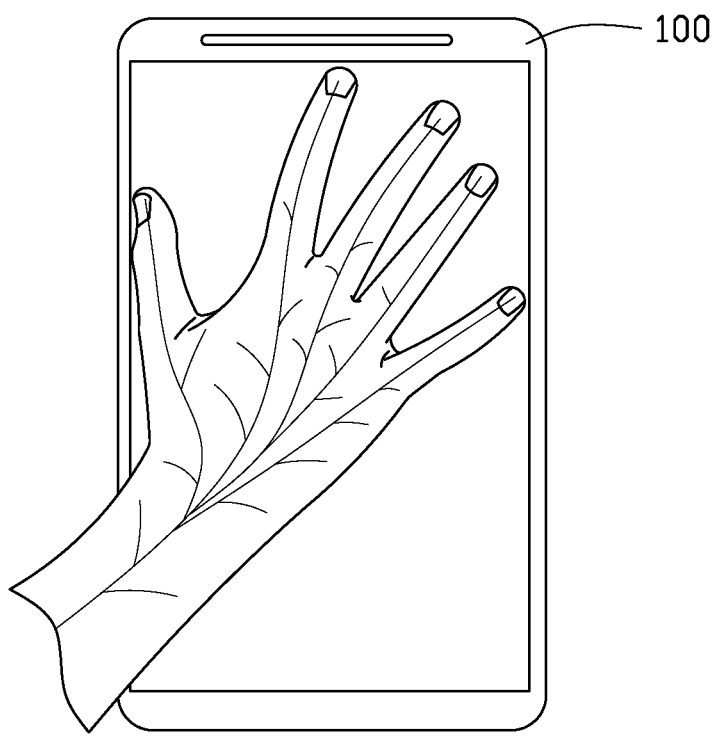
FIG. 7 is a schematic view showing the sensing device according to the first embodiment of the present disclosure when sensing a blood vessel image.

The sensing device 100 is not only adapted for sensing a suspension operation, but also adapted for sensing data about a blood vessel to form an image. As shown in FIG. 7, when the sensing device 100 is sensing the blood vessel, after the near infrared light emitted by the second light emitting element 122 irradiates an exterior of the sensing device 100 (such as palm of hand), blood vessels in the palm (such as veins) absorb most of the near infrared light, and the near infrared light irradiating an avascular area of the palm is reflected, such that the near-infrared light absorbed by the quantum dot layer 216 is changed. The sensing signal is then fed back to a signal processor to form a specific blood vessel map. It can be understood that, the exterior of the sensing device 100 may not be limited to the vein of the palm, but may be other organisms or biological structures.

As shown in FIG. 2, in this embodiment, each of the light emitting elements 120 comprises a cathode 1201, an anode 1202, and a light emitting material 1203 located between the cathode 1201 and the anode 1202. The light emitting material 1203 can emit light by adjusting the voltage applied by the cathode 1201 and the anode 1202. In this embodiment, the cathodes 1201 of the light emitting elements 120 are spaced apart from each other, and the anodes 1202 of the light-emitting elements 120 share a continuous conductive layer. In this embodiment, the cathode 1201 is located on a side of the light emitting material 1203 adjacent to the TFT substrate 11, and the anode 1202 is located on a side of the light emitting material 1203 away from the TFT substrate 11.

In this embodiment, the wavelength of light emitted by the light emitting material 1203 ranges from 830 nm to 1550 nm. In this embodiment, the cathode 1201 may be made of metal such as aluminum (Al), titanium (Ti), the anode 1202 may be made of indium tin oxide (ITO). It can be understood that, the anode 1202 may further comprise gold (Au) or titanium (Ti) for ohmic contact with the light emitting material 1203. The light emitting material 1203 of the first light emitting element 121 may be made of GaAsP or InGaN, and the light emitting material 1203 of the second light emitting element 122 may be made of AlGaAs or InGaAs.

As shown in FIG. 2, the sensing device 100 further comprises a passivation layer 13 located on a side of the anode 1202 away from the light emitting material 1203, and a black matrix 14 located on a side of the passivation layer 13 away from the light emitting layer 12. The black matrix 14 may be made of opaque material such as chrome (Cr), molybdenum (Mo), or black resin. The first light emitting elements 121 and the second light emitting elements 122 are spaced apart by a black matrix 14, each QD TFT 21 is located to correspond to the black matrix 14. The projection of each QD TFT 21 on the cover 13 is overlapped with the black matrix 14 to avoid blocking the light emitted by the light emitting element 120.

In the following embodiments, elements having the same or similar functions as those of the first embodiment are described by the same reference numerals.

Figure 8:
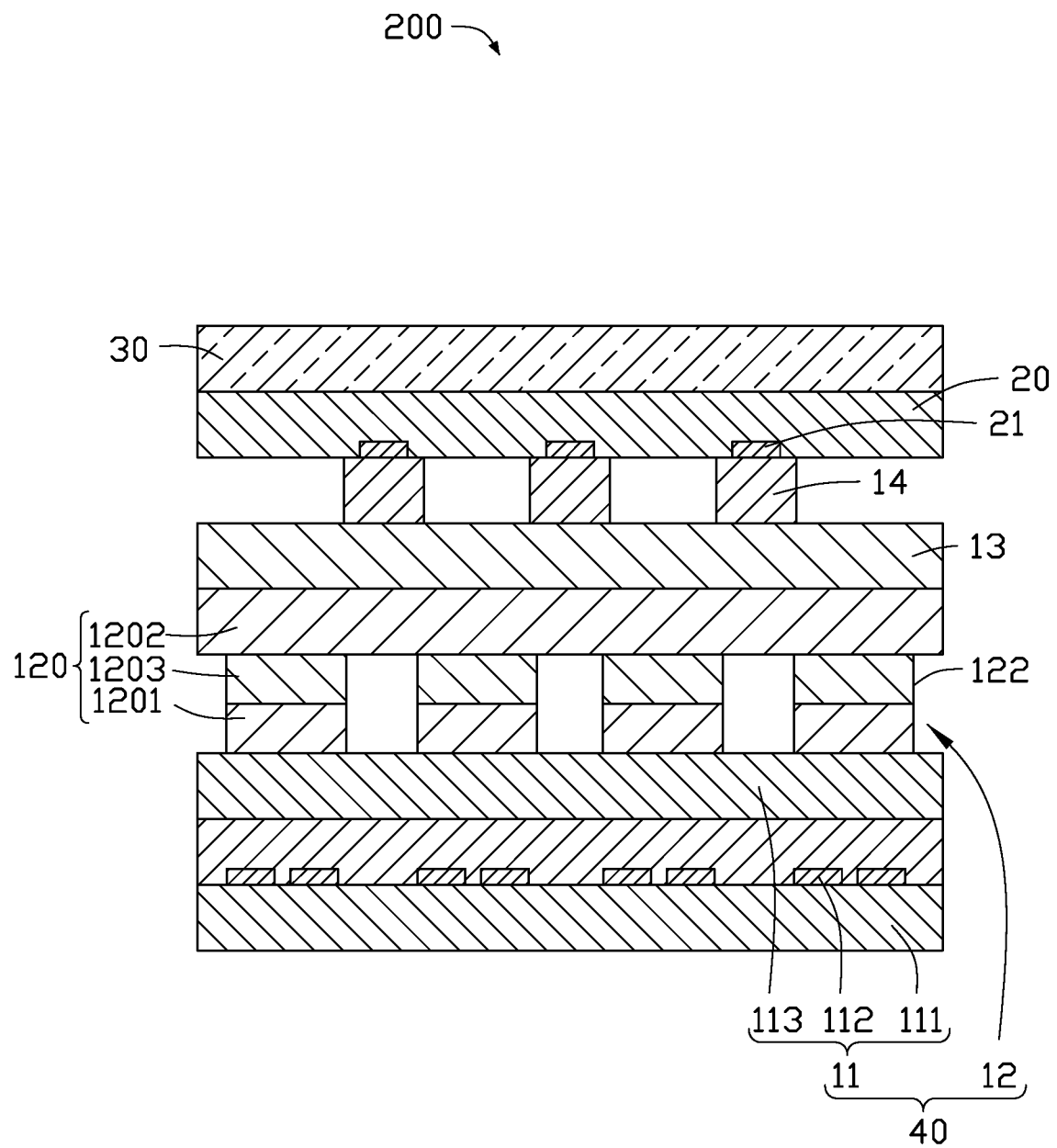
FIG. 8 is a cross-sectional view showing a sensing device according to a second embodiment of the present disclosure.

As shown in FIG. 8, a sensing device 200 of a second embodiment comprises a light emitting module 40, a sensing layer 20, and a cover 30. The cover 30 is made of transparent material such as glass, plastic, or other transparent materials.

In this embodiment, the light emitting module 40 comprises a TFT substrate 11 and a light emitting layer 12 formed on the TFT substrate 11. The TFT substrate 11 comprises a substrate 111, a plurality of thin film transistors (TFTs) 112 formed on the substrate 111, and a planarization layer 113 covering the TFTs 112. The light emitting layer 12 comprises a plurality of light emitting elements 120. In this embodiment, the near infrared light emitted by the light emitting element 120 has a wavelength between 830 nm and 1550 nm.

In this embodiment, the light emitting elements 120 are micro light emitting diodes (micro LEDs). The TFTs 112 can be used to control the light emitting elements 120. A size of each of the micro light emitting diodes may be smaller than 50×50 μm. The light emitting elements 120 are arranged in an array.

Figure 9:
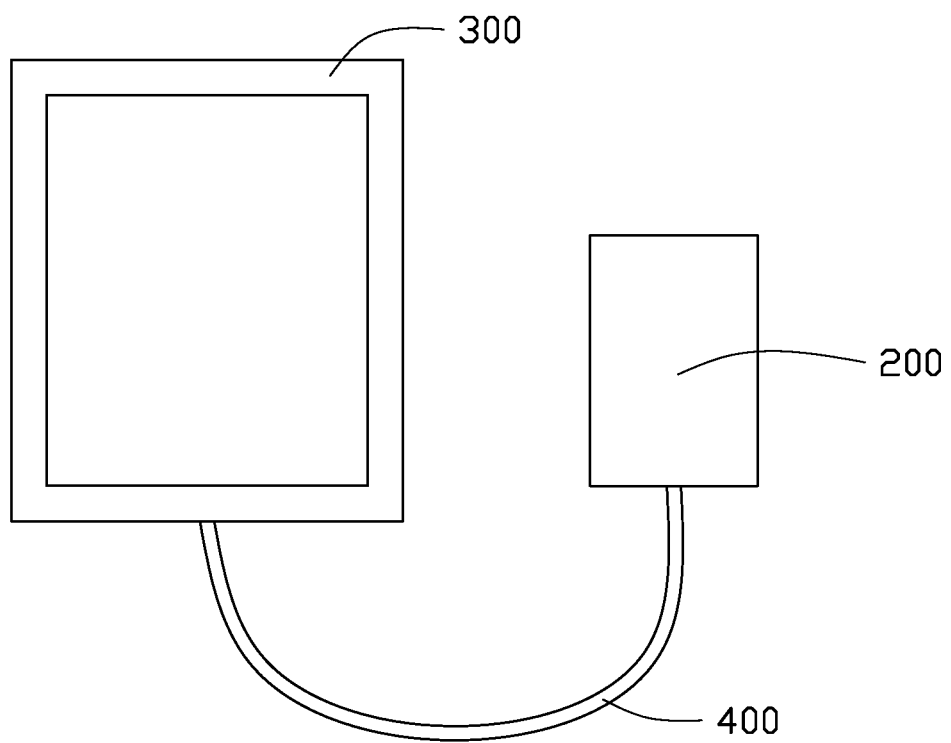
FIG. 9 is a planar view of a sensing device according to a second embodiment of the present disclosure coupled to a display.
Figure 10:
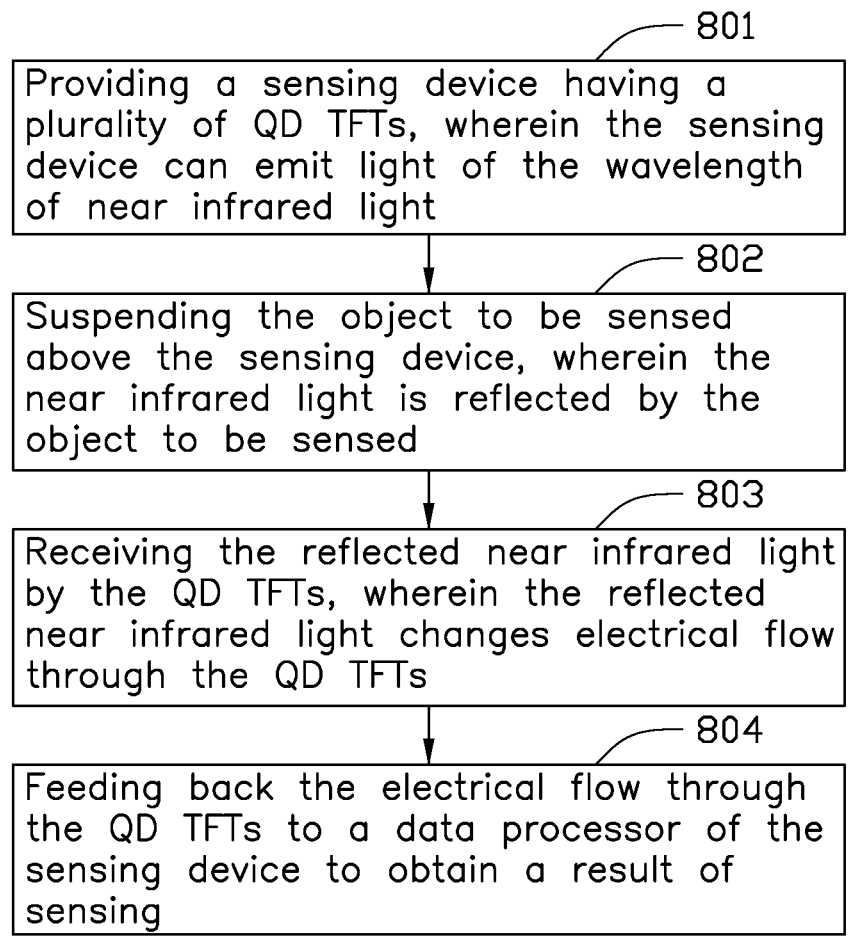
FIG. 10 is a flowchart of a method of sensing method applied to the sensing device.

As show in FIG. 9, in this embodiment, the sensing device 200 can sense suspension operations or biometrics, and can display the result of the sensing through an external display 300. The sensing device 200 can be electrically coupled to the display 300 through a conductive line 400.

As shown in FIG. 9, a method for carrying out sensing comprises:

Step S801: a sensing device 100 having a plurality of QD TFTs 21 is provided, the sensing device can emit light of the wavelength of near infrared light.

Each QD TFT 21 comprises gate electrode 211, a gate insulating layer 212, a channel layer 213, a source electrode 214, and a drain electrode 215. In this embodiment, each QD TFTs 21 further comprises a quantum dot layer 216 and an insulating layer 217. The quantum dot layer 216 covers the channel layer 213 and is in direct contact with the channel layer 213. The insulating layer 217 covers the source electrode 214, the drain electrode 215, and the quantum dot layer 216.

In an embodiment, the sensing device 100 can comprise a display panel 10. The display panel 10 comprises a thin film transistor array substrate (TFT substrate) 11 and a light emitting layer 12 formed on the TFT substrate 11. The light emitting layer 12 comprises a plurality of light emitting elements 120, the light emitting elements 120 comprise a plurality of first light emitting elements 121 for display and a plurality of second light emitting elements 122 that emit near infrared light.

In an embodiment, the sensing device 100 can display the result of the sensing through an external display 300 (as shown in FIG. 9). The sensing device 100 may comprise a light emitting module 40. The light emitting module 40 comprises a thin film transistor array substrate (TFT substrate) 11 and a light emitting layer 12 formed on the TFT substrate 11. The light emitting layer 12 comprises a plurality of light emitting elements 120 that emit near infrared light.

Step S802: an exterior of the sensing device 100 to be sensed (for example, an animate object such as a finger) is suspended above the sensing device 100, and the near infrared light is reflected by the exterior.

In this embodiment, the blood vessels in the fingers (such as veins) absorb most of the near infrared light, and the near infrared light that irradiates an avascular area of the finger is reflected.

Step S803: the reflected near infrared light is received by the QD TFTs 21 and changes electrical flow through the QD TFTs 21.

After the near infrared light irradiates the finger, blood vessels in the fingers (such as veins) absorb most of the near infrared light, and the near infrared light that is irradiated to an avascular area of the finger is reflected, such that the near-infrared light absorbed by the quantum dot layer 216 is changed and forms a sensing signal. The sensing signal is then fed back to a signal processor to form a specific blood vessel map showing the coordinates of the blood vessels.

Step S804: the electrical flow through the QD TFTs 21, or a change therein, is fed back to a data processor 204 of the sensing device 100 to obtain a result of sensing.

In this embodiment, the electrical flow is fed back to the data processor 204 to form a particular blood vessel map.

When the sensing device 100 is adapted for sensing suspension operations, the sensing device 100 can determine the coordinates of the blood vessels. When the finger moves, the sensing device 100 can detect the movement trajectory of the blood vessels to sense the suspension operation.

When the sensing device 100 is adapted for sensing biometrics the sensing device 100 can form a blood vessel map of the exterior.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A sensing device, comprising:
a display panel, wherein the display panel comprises light emitting elements, the light elements comprise a plurality of first light emitting elements adapted for displaying and a plurality of second light emitting elements adapted for sensing, each of the plurality of second light emitting elements emits light of a wavelength of near infrared light;
a sensing layer, wherein the sensing layer is stacked with the light emitting elements, the sensing layer comprises a plurality of quantum dot thin film transistors, and each of the plurality of quantum dot thin film transistors comprises a channel layer and a quantum dot layer covering the channel layer;
wherein the plurality of quantum dot thin film transistors receive reflected light of the light emitted by the plurality of second light emitting elements.

2. The sensing device of claim 1, wherein the plurality of first light emitting elements and the plurality of second light emitting elements are on a same layer.

3. The sensing device of claim 1, wherein the display panel defines a plurality of pixel units, each of the plurality of pixel units comprises at least one of the first light emitting elements and at least one of the second light emitting elements.

4. The sensing device of claim 3, wherein each of the plurality of pixel units comprises one of the first light emitting elements that emits red light, one of the first light emitting elements that emits green light, one of the first light emitting elements that emits blue light, and one of the second light-emitting elements.

5. The sensing device of claim 1, wherein the sensing layer is between the display panel and an exterior of the sensing device.

6. The sensing device of claim 1, wherein the sensing device further comprises a black matrix, the plurality of first light emitting elements and the plurality of second light emitting elements are spaced apart by the black matrix, a projection of each of the plurality of quantum dot thin film transistor on the display panel is overlapped with the black matrix.

7. The sensing device of claim 1, wherein each of the plurality of quantum dot thin film transistors further comprises a gate electrode, a gate insulating layer, a source electrode, a drain electrode and an insulating layer covering the source electrode, drain electrode and the quantum dot layer.

8. The sensing device of claim 1, wherein the light emitting elements are arranged in an array.

9. The sensing device of claim 1, wherein the near infrared light emitted by the plurality of second light emitting elements has a wavelength between 830 nm and 1550 nm.

10. The sensing device of claim 1, wherein a particle diameter of a quantum dot in the quantum dot layer is between 3 nm and 9 nm.

11. A sensing device, comprising:
 a light emitting module, wherein the light emitting module comprises light emitting elements for sensing, each of the light emitting elements emits light of a wavelength of near infrared light;
 a sensing layer, wherein the sensing layer is stacked with the light emitting elements, the sensing layer comprises a plurality of quantum dot thin film transistors, and each of the plurality of quantum dot thin film transistors comprises an channel layer and a quantum dot layer covering the channel layer;
 wherein the plurality of quantum dot thin film transistor receive reflected light of the light emitted by the light emitting elements.

12. The sensing device of claim 11, wherein the sensing device is coupled to a display device by a conductive line.

13. The sensing device of claim 11, wherein each of the plurality of quantum dot thin film transistors further comprises a gate electrode, a gate insulating layer, a source electrode, a drain electrode and an insulating layer covering the source electrode, drain electrode and the quantum dot layer.

14. The sensing device of claim 11, wherein the light emitting elements are arranged in an array.

15. A method for sensing, comprises:
 providing a sensing device having a plurality of quantum dot thin film transistors, wherein the sensing device emits light of a wavelength of near infrared light;
 suspending the object to be sensed above the sensing device, wherein the near infrared light is reflected by an exterior of the sensing device;
 receiving the reflected near infrared light by the quantum dot thin film transistors, wherein the reflected near infrared light changes electrical signals transmitting through the QD TFTs; and
 feeding back the electrical signal transmitting through the QD TFTs to a data processor of the sensing device to obtain a sensing result.

16. The method of claim 15, wherein a quantum dot in each of the plurality of quantum dot thin film transistors generates a current according to the reflected near infrared light, so that the conductivity of a channel layer in each of the plurality of quantum dot thin film transistors is changed, thereby changing a electrical flow through each of the plurality of quantum dot thin film transistors.

* * * * *